US009854669B2

(12) United States Patent
Inagaki et al.

(10) Patent No.: US 9,854,669 B2
(45) Date of Patent: Dec. 26, 2017

(54) PACKAGE SUBSTRATE

(71) Applicant: IBIDEN CO., LTD., Ogaki (JP)

(72) Inventors: Yasushi Inagaki, Ogaki (JP); Toshiki Furutani, Ogaki (JP)

(73) Assignee: IBIDEN CO., LTD., Ogaki-shi (JP)

(*) Notice: Subject to any disclaimer, the term of this patent is extended or adjusted under 35 U.S.C. 154(b) by 0 days.

(21) Appl. No.: 14/953,141

(22) Filed: Nov. 27, 2015

(65) Prior Publication Data
US 2016/0164159 A1 Jun. 9, 2016

(30) Foreign Application Priority Data
Dec. 3, 2014 (JP) .................................. 2014-244556

(51) Int. Cl.
*H05K 1/02* (2006.01)
*H01L 23/538* (2006.01)
*H05K 3/46* (2006.01)
*H01L 23/14* (2006.01)
*H05K 3/10* (2006.01)

(52) U.S. Cl.
CPC ....... *H05K 1/0296* (2013.01); *H01L 23/5383* (2013.01); *H01L 23/5384* (2013.01); *H05K 3/4661* (2013.01); *H05K 3/4682* (2013.01); *H05K 3/4688* (2013.01); *H01L 23/145* (2013.01); *H01L 23/5386* (2013.01); *H01L 2224/16227* (2013.01); *H01L 2224/32225* (2013.01); *H01L 2224/73204* (2013.01); *H01L 2924/15192* (2013.01); *H01L 2924/15311* (2013.01); *H05K 1/0243* (2013.01); *H05K 3/108* (2013.01)

(58) Field of Classification Search
USPC .................................. 174/260, 255; 361/782
See application file for complete search history.

(56) References Cited

U.S. PATENT DOCUMENTS 5,296,649 A * 3/1994 Kosuga .............. B23K 35/0222
174/250
5,476,690 A * 12/1995 Ohta ...................... G03F 7/033
427/250

(Continued)

FOREIGN PATENT DOCUMENTS

JP    2010-067887 A    3/2010

*Primary Examiner* — William H Mayo, III
*Assistant Examiner* — Krystal Robinson
(74) *Attorney, Agent, or Firm* — Oblon, McClelland, Maier & Neustadt, L.L.P.

(57) ABSTRACT

A printed wiring board includes a first insulating layer, a first conductor layer formed on first surface of the first insulating layer, a second conductor layer formed on second surface of the first insulating layer, a first via structure formed in the first insulating layer such that the first via structure is connecting the first and second conductor layers, a second insulating layer formed on the second surface of the first insulating layer such that the second conductor layer is embedded into the second insulating layer, a third conductor layer formed on the second insulating layer, and a second via structure formed in the second insulating layer such that the second via structure is connecting the second and third conductor layers. The second conductor layer includes a dedicated wiring layer which transmits data between two electronic components to be mounted to the first surface of the first insulating layer.

20 Claims, 14 Drawing Sheets

(56) References Cited

U.S. PATENT DOCUMENTS

| | | | | |
|---|---|---|---|---|
| 6,143,116 A | * | 11/2000 | Hayashi | B32B 37/18 |
| | | | | 156/233 |
| 6,518,514 B2 | * | 2/2003 | Suzuki | H05K 3/4069 |
| | | | | 174/255 |
| 8,476,535 B2 | * | 7/2013 | Sahara | H05K 1/186 |
| | | | | 174/254 |
| 2011/0147061 A1 | * | 6/2011 | Leung | H01L 21/486 |
| | | | | 174/260 |

* cited by examiner

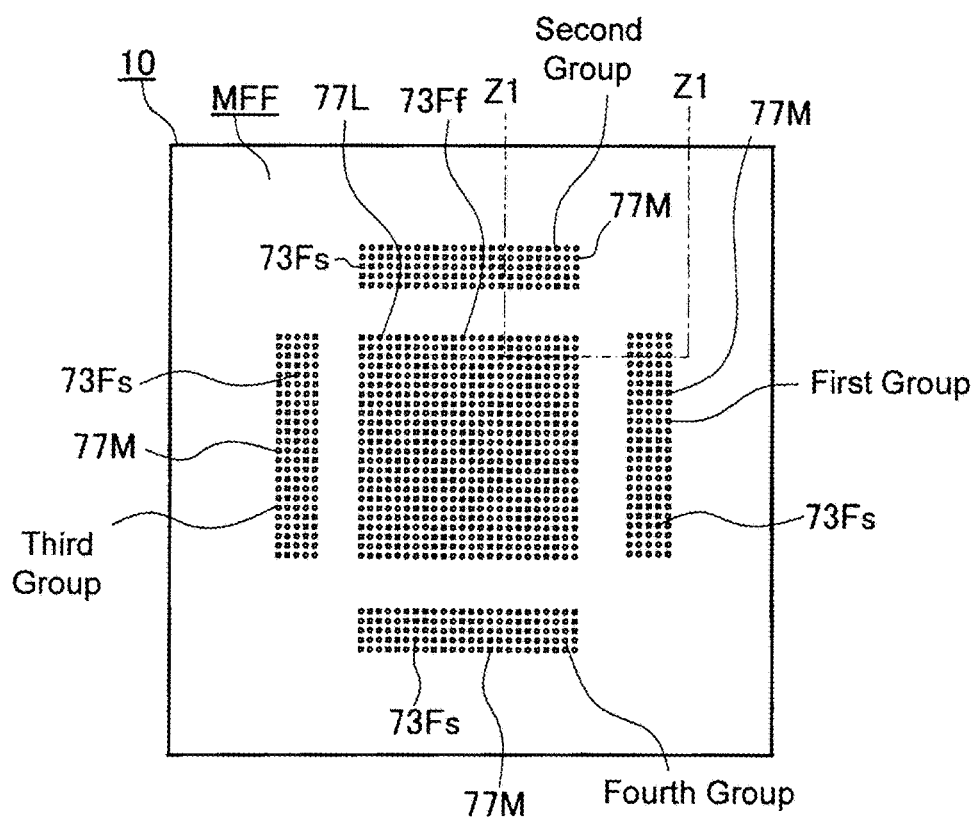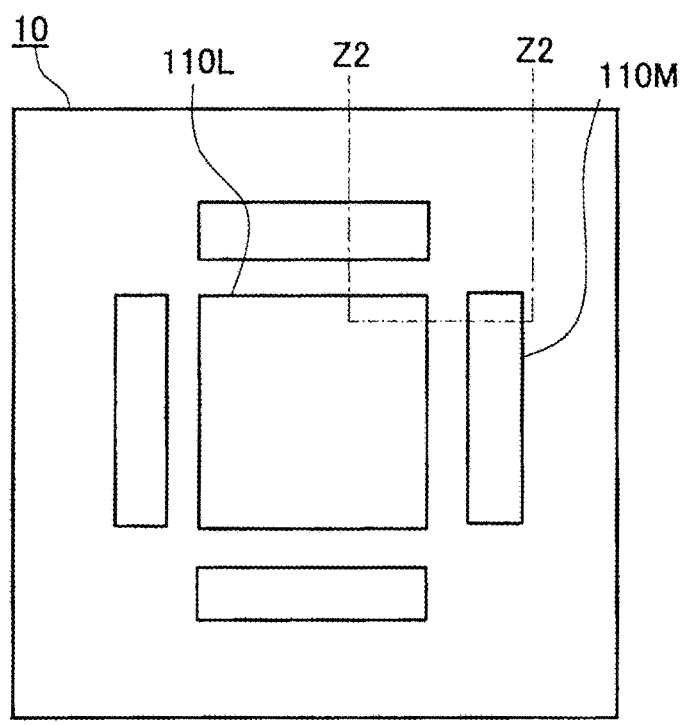

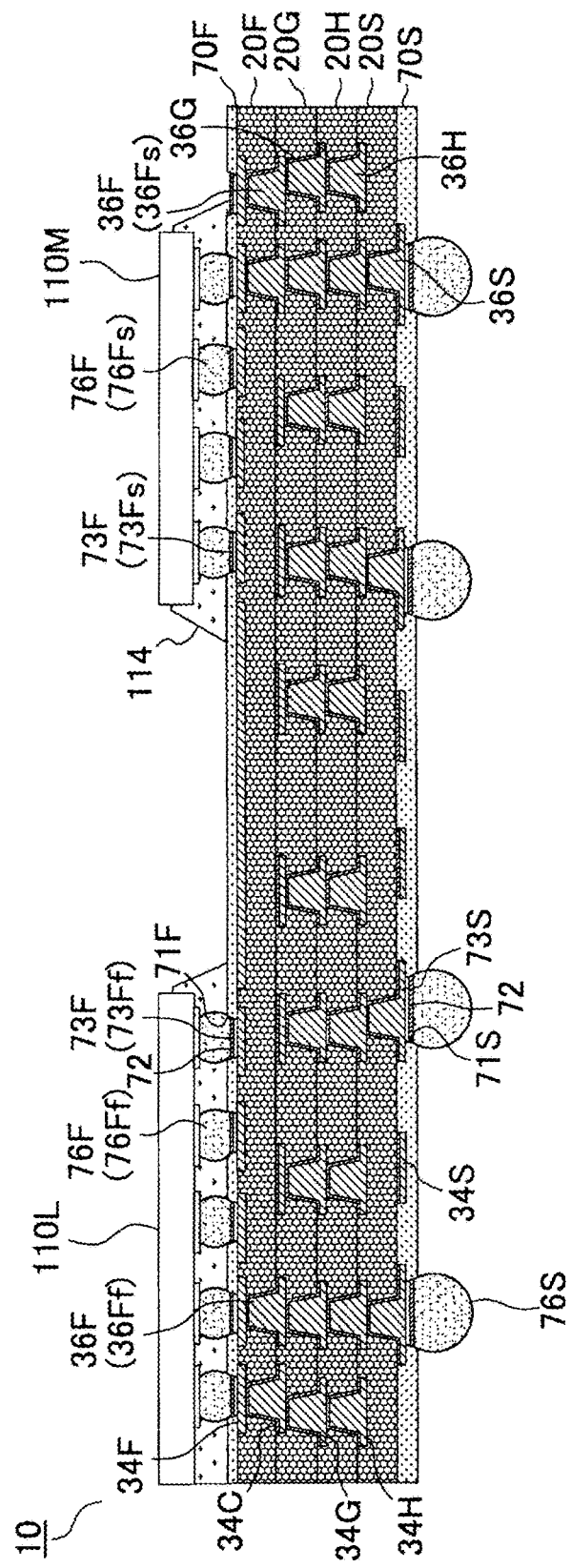

PACKAGE SUBSTRATE

CROSS-REFERENCE TO RELATED APPLICATIONS

The present application is based upon and claims the benefit of priority to Japanese Patent Application No. 2014-244556, filed Dec. 3, 2014, the entire contents of which are incorporated herein by reference.

BACKGROUND OF THE INVENTION

Field of the Invention

The present invention relates to a package substrate on which electronic components are mounted.

Description of Background Art

In a wiring board of Japanese Patent Laid-Open Publication No. 2010-67887, all conductor layers are exposed from a lower side resin insulating layer, and a roughened layer is provided. The entire contents of this publication are incorporated herein by reference.

SUMMARY OF THE INVENTION

According to one aspect of the present invention, a printed wiring board includes a first resin insulating layer, a first conductor layer formed on a first surface of the first resin insulating layer, a second conductor layer formed on a second surface of the first resin insulating layer, a first via conductor structure formed in the first resin insulating layer such that the first via conductor structure is connecting the first conductor layer and the second conductor layer, a second resin insulating layer formed on the second surface of the first resin insulating layer such that the second conductor layer is embedded into the second resin insulating layer, a third conductor layer formed on the second resin insulating layer, and a second via conductor structure formed in the second resin insulating layer such that the second via conductor structure is connecting the second conductor layer and the third conductor layer. The second conductor layer includes a dedicated wiring layer which transmits data between two electronic components to be mounted to the first surface of the first resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7A is a plan view illustrating pad group;

FIG. 7B illustrates a plan view of the application example;

FIG. 11 illustrates a cross-sectional view of an application example of the package substrate according to the second embodiment;

DETAILED DESCRIPTION OF THE EMBODIMENTS

Figure 1:
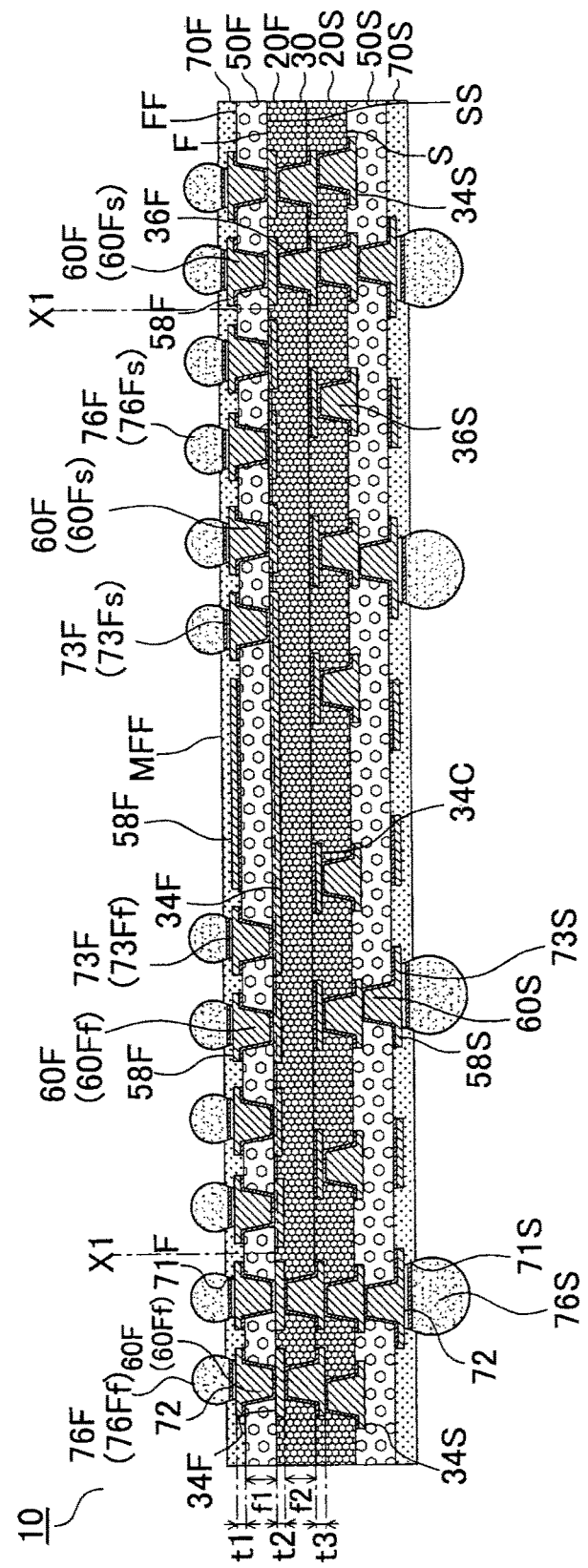
FIG. 1 illustrates a cross-sectional view of a package substrate according to a first embodiment of the present invention.

The embodiments will now be described with reference to the accompanying drawings, wherein like reference numerals designate corresponding or identical elements throughout the various drawings.

First Embodiment

FIG. 7A illustrates a mounting surface (MFF) of a package substrate according to a first embodiment of the present invention. FIG. 7B illustrates a plan view of an application example of the present embodiment. Electronic components are mounted on the package substrate of the present embodiment.

As illustrated in FIG. 7A, a mounting area (77L) for mounting a first electronic component such as a logic IC is formed at a central part of the mounting surface (MFF) of the package substrate. Primary pads (73Ff) for mounting the first electronic component are formed in a lattice-like shape in the mounting area (77L). A primary pad group is formed by the primary pads (73Ff). Solder bumps for mounting the first electronic component are formed on the primary pads. A mounting area (77M) for mounting a second electronic component such as a memory is formed outside of the mounting area (77L). In FIG. 7A, four mounting areas (77M) are formed around the mounting area (77L). Secondary pads (73Fs) for mounting a second electronic component are formed in a lattice-like shape in each of the mounting areas (77M). A secondary pad group is formed by the secondary pads. Solder bumps for mounting the second electronic component are formed on the secondary pads. In FIG. 7B, a logic IC (110L) is mounted on the solder bumps of the mounting area (77L), and a memory (110M) is mounted on the solder bumps of each of the mounting areas (77M).

Figure 2:
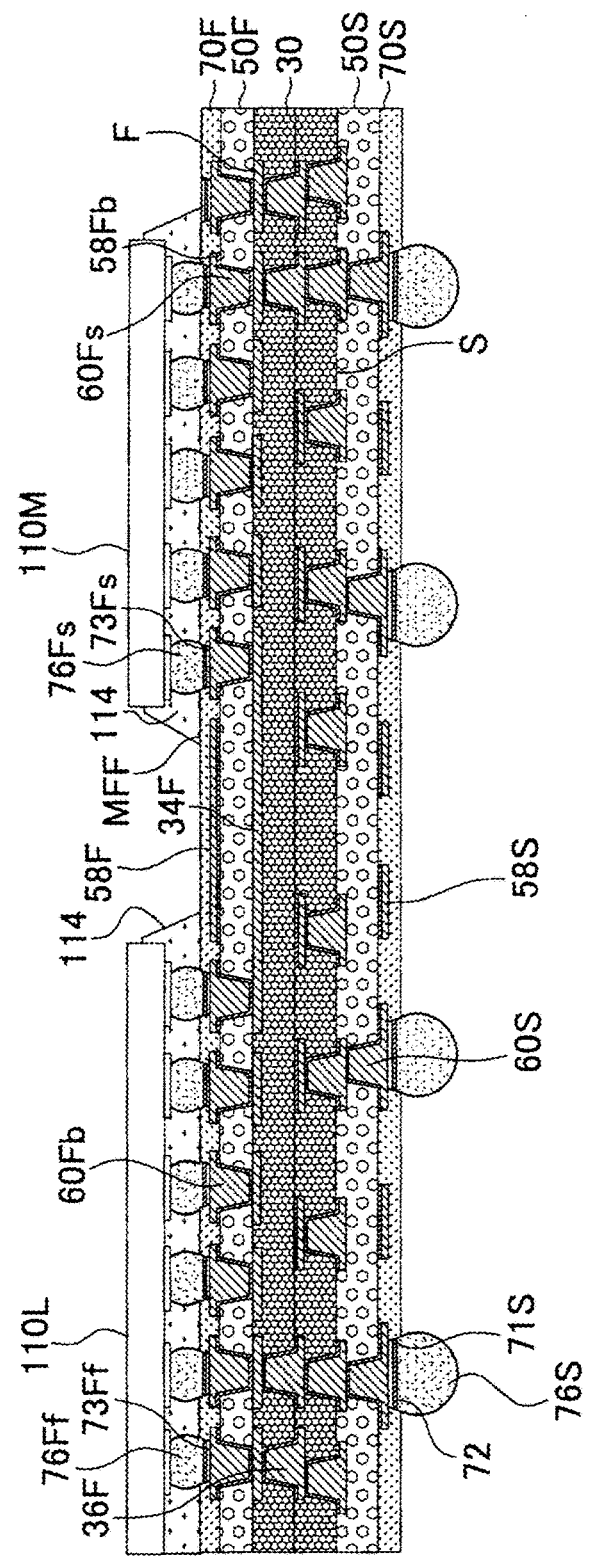
FIG. 2 illustrates a cross-sectional view of an application example of the package substrate according to the first embodiment.

A cross section of the package substrate of the first embodiment along a line segment Z1-Z1 illustrated in FIG. 7A is illustrated in FIG. 1. A cross section of the application example of the first embodiment along a line segment Z2-Z2 illustrated in FIG. 7B is illustrated in FIG. 2. Solder bumps (76Ff) for mounting the first electronic component (110L)

are formed on the primary pads (73Ff). Solder bumps (76Fs) for mounting the second electronic component (110M) are formed on the secondary pads (73Fs).

As illustrated in FIG. 1, the package substrate of the first embodiment has a first conductor layer (58F) that contains pads for mounting an electronic component. Further, the package substrate has an upper side first resin insulating layer (50F) that supports the first conductor layer (58F). The upper side first resin insulating layer (50F) has an upper side first surface (FF) and a lower side second surface (SS).

In the first embodiment, primary via conductors (60Ff) that connect to the primary pads (73Ff) and secondary via conductors (60Fs) that connect to the secondary pads (73Fs) are formed in the upper side first resin insulating layer (50F). It is preferable that the primary via conductors be formed directly below the primary pads. It is preferable that the secondary via conductors be formed directly below the secondary pads.

A second conductor layer (34F) including second conductor circuits is formed below the upper side first resin insulating layer (50F). The primary pads and the secondary pads are connected by the second conductor circuits. That is, exchange of a signal or the like between the first electronic component and the second electronic component is performed via the second conductor layer. The second conductor layer (34F) functions as a dedicated wiring layer for data transmission between the first electronic component and the second electronic component. When the second conductor layer (34F) is arranged directly below the outermost resin insulating layer (first resin insulating layer) (50F), a distance between an electronic component and the dedicated wiring layer is reduced, and thus is preferable. That the second conductor circuits are strip lines or microstrip lines allows electrical characteristics to be improved and thus is desirable. When signal lines are strip lines, the signal lines (second conductor layer) are sandwiched by the outermost conductor layer (first conductor layer (58F)) and a third conductor layer (34C).

A second resin insulating layer (20F) is formed below the first resin insulating layer and the second conductor layer (dedicated wiring layer). The third conductor layer (34C) is formed below the second resin insulating layer (20F). Supply of power to an electronic component, or the like, is performed via the third conductor layer (34C). Therefore, the primary pads and the secondary pads include pads that are connected to the third conductor layer (34C). Connection between the pads (that are connected to the middle conductor layer) and the middle conductor layer is performed via first via conductors (60F) and second via conductors (36F).

The package substrate 10 illustrated in FIG. 1 has a middle substrate 30 that includes the second resin insulating layer (20F) and a resin insulating layer (20S). The middle substrate 30 has a main surface (F) and a sub surface (S) that is on an opposite side of the main surface. The above-described second conductor layer (34F) is formed on the main surface side of the middle substrate, and a conductor layer (34S) is formed on the sub surface side. The second conductor layer (34F) and the conductor layer (34S) are connected via the second via conductors (36F) formed in the second resin insulating layer (20F), the third conductor layer (34C), and via conductors (36S) formed in the resin insulating layer (20S).

A lower side resin insulating layer (50S) is formed on the sub surface (S) of the middle substrate 30. A lowermost conductor layer (58S) is formed on the lower side resin insulating layer (50S). The conductor layer (34S) on the middle substrate and the lowermost conductor layer (58S) are connected via via conductors (60S).

A solder resist layer (70F) having openings (71F) is formed on the upper side first resin insulating layer (50F), and a solder resist layer (70S) having openings (71S) is formed on the lower side resin insulating layer (50S). The primary pads (73Ff) and the secondary pads (73Fs) are exposed by the openings (71F) of the solder resist layer (70F) on the upper side first resin insulating layer (50F). The solder bumps (first solder bumps) (76Ff) are formed on the primary pads (73Ff), and the solder bumps (second solder bumps) (76Fs) are formed on the secondary pads (73Fs). It is preferable that a melting point of the first solder bumps and a melting point of the second solder bumps be different. Mounting yield and connection reliability are improved. Further, replacement of the electronic components can be easily performed. A surface of the solder resist layer (70F) on the first resin insulating layer (50F) forms the mounting surface (MFF) for mounting an electronic component. Solder bumps (third solder bumps) (76S) for connecting to a motherboard are formed on pads (73S) that are exposed by the openings (71S) of the solder resist layer (70S) on the lower side resin insulating layer (50S). A metal film 72 such as Ni/Au or Ni/Pd/Au is formed on each of the pads (73Ff, 73Fs, 73S). As illustrated in FIGS. 2 and 7B, the IC chip (110L) is mounted on the solder bumps (76Ff) for mounting the IC chip, and the memory (110M) is mounted on the solder bumps (76Fs) for mounting the memory. The package substrate 10 is mounted on a motherboard via the solder bumps (76S). It is preferable that the melting point of the first solder bumps, the melting point of the second solder bumps, and a melting point of the third solder bumps be different from each other. Mounting yield and connection reliability are high.

Figure 8:
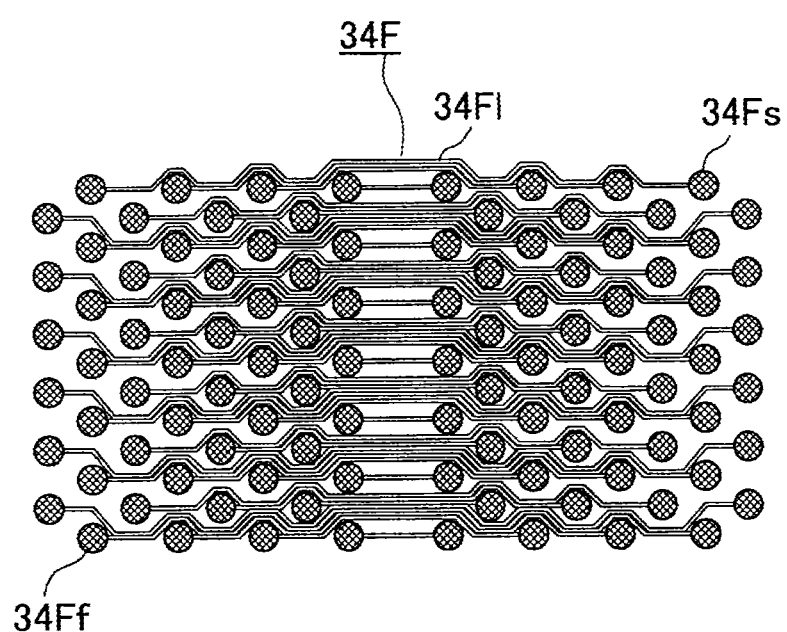
FIG. 8 is a plan view of a second conductor layer.

FIG. 8 is a plan view illustrating a portion of the dedicated wiring layer (second conductor layer) (34F). FIG. 8 corresponds to an X1-X1 cross section in FIG. 1. Conductors that are each depicted in a round shape in the figure are pads. Pads that are depicted on a left side are primary via conductor pads (34Ff), and pads that are depicted on a right side are secondary via conductor pads (34Fs). The primary via conductors (60Ff) are formed on the primary via conductor pads, and the secondary via conductors (60Fs) are formed on the secondary via conductor pads. The second conductor layer (34F) has second conductor circuits (34F1) that connect the primary via conductor pads (34Ff) and the secondary via conductor pads (34Fs). In the package substrate of the first embodiment, data transmission between the first electronic component such as a logic chip and the second electronic component such as a memory chip is mainly performed via the second conductor layer (34F).

In the package substrate of the first embodiment, the dedicated wiring layer is formed directly below the upper side first resin insulating layer (50F). Therefore, a wiring distance between the electronic components are reduced. A signal transmission speed between the electronic components can be increased. The package substrate of the first embodiment has the dedicated wiring layer. Therefore, the signal lines have similar electrical characteristics. Transmission times of signals of a byte unit become uniform. Even when the transmission speed is fast, a signal can be properly transmitted. Processing is not slowed even when an amount of information is increased.

In general, data of one bit is transmitted via one signal line (one second conductor circuit). A command or data that is processed by electronic equipment such as a personal computer is structured in one byte (8 bits). When the signal lines have different widths or thicknesses, the signal lines have different electrical characteristics such as transmission speeds. Therefore, differences may occur in transmission times of signals of a byte unit. It is expected that the signals are not properly processed or a processing time becomes long. It is expected that differences occur in transmission time between bits in one byte. Further, due to variations in the widths and the thicknesses of the signal lines, there may exist signal lines that have slow transmission speeds. It is expected that, due to these signal lines, processing is slowed.

The first embodiment has the dedicated wiring layer. Therefore, when the conductor layer (dedicated wiring layer) that contains the signal lines is formed, manufacturing conditions and the like are set to match the widths and thicknesses of the signal lines. Therefore, according to the first embodiment, variations in the widths and the thicknesses of signal lines are reduced. The signal lines have substantially the same transmission speeds. The signals are properly processed. The processing is not slowed even when an amount of information is large.

Figure 9A:
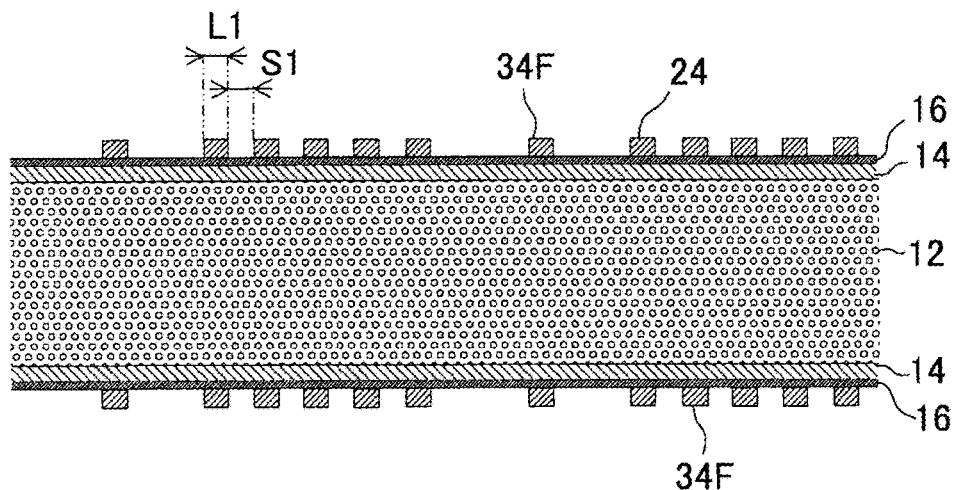
FIG. 9A illustrates a Y1-Y1 cross section of FIG. 3D.
Figure 9B:
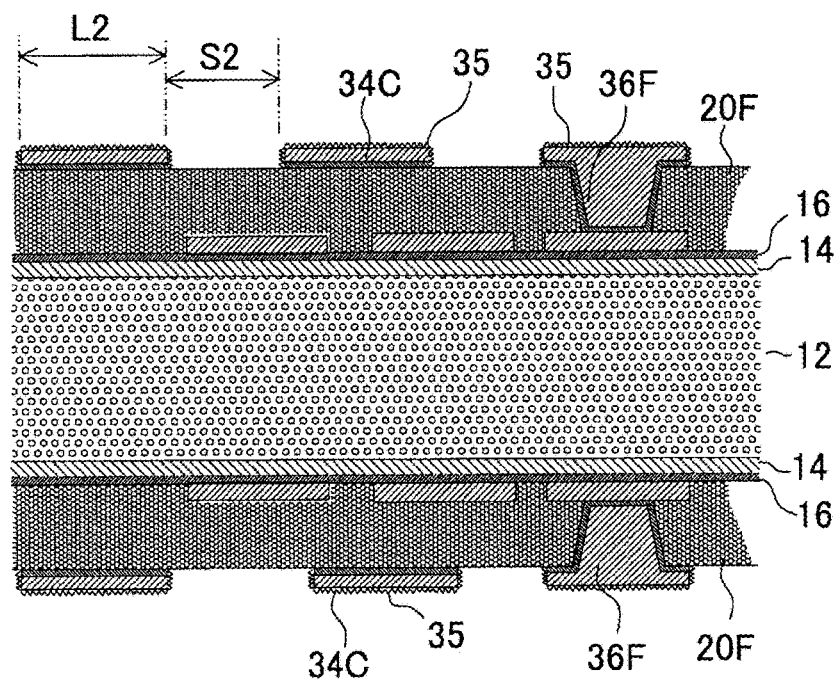
FIG. 9B illustrates a Y2-Y2 cross section of FIG. 5B.

As illustrated in FIG. 1, the second conductor layer (34F) is embedded in the second resin insulating layer (20F) and only an upper surface thereof is exposed from the second resin insulating layer (20F). That is, a side surface of the second conductor layer (34F) is embedded in the second resin insulating layer (20F). FIG. 9B illustrates the third conductor layer (34C) before being embedded in the second resin insulating layer. A roughened layer 35 is provided in the third conductor layer (34C). FIG. 9A illustrates the second conductor layer (34F) before being embedded in the first resin insulating layer. A roughened layer is not provided on the side surface and the upper surface of the second conductor layer (34F). A line width (L1) and a space width (S1), L1/S1, of the second conductor layer (34F) are respectively set to 7.5/7.5 μm or less and 3/3 μm or more. Even when the space width is 3 μm, since a roughened layer is not provided, the first resin insulating layer can be filled in the space without leaving air bubbles therein. Therefore, even when a wiring density of the second conductor layer (34F) is increased, insulation reliability is hardly lowered, and a signal transmission amount can be increased. A second surface of the second conductor layer (34F) and a side surface of the second conductor layer have an arithmetic average roughness (Ra) of 0.02-0.18 μm. More preferably, the arithmetic average roughness (Ra) is 0.1 μm. A first surface of the second conductor layer has an arithmetic average roughness (Ra) of 0.35-0.51 μm. More preferably, the arithmetic average roughness (Ra) is 0.43 μm.

A thickness (t2) of the conductor circuits (second conductor layer) of the dedicated wiring layer (34F) is thinner than a thickness (t1) of the first conductor layer (58F) and a thickness (t3) of the third conductor layer (34C). The thickness (t1) of the first conductor layer (58F) and the thickness (t3) of the third conductor layer (34C) are substantially the same. The thickness (t2) of the second conductor layer (34F) is ½ or less of the thickness of the first conductor layer (58F) and is 2-8 μm. The thickness (t1) of the first conductor layer (58F) and the thickness (t3) of the third conductor layer (34C) are 12-18 μm. As a result, fine conductor circuits can be formed in the dedicated wiring layer. Sophisticated electronic components can be mounted on the package substrate. An insulation distance (f1) of the first resin insulating layer (20F) between the conductor layers is 10-30 μm, and an insulation distance (f2) of the second resin insulating layer (20F) between the conductor layers is 25-45 μm.

Method for Manufacturing Package Substrate of First Embodiment

A method for manufacturing the package substrate 10 of the first embodiment is illustrated in FIG. 3A-6D.

Figure 3A:
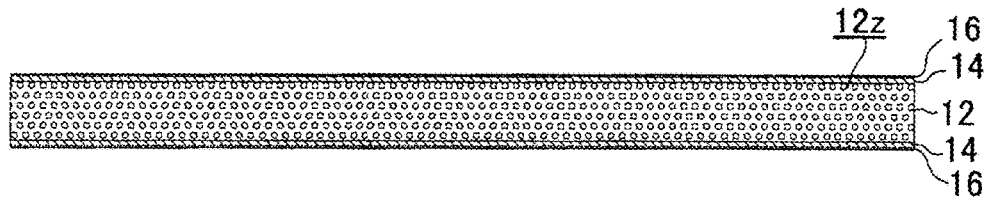
FIG. 3A-3E are process diagrams illustrating a method for manufacturing the package substrate of the first embodiment.

A resin substrate 12, on both sides of which a carrier copper foil 14 is laminated, is prepared, and a support plate (12z) is prepared that is obtained by affixing an ultra-thin copper foil 16 on the carrier copper foil 14 (FIG. 3A).

Figure 3B:
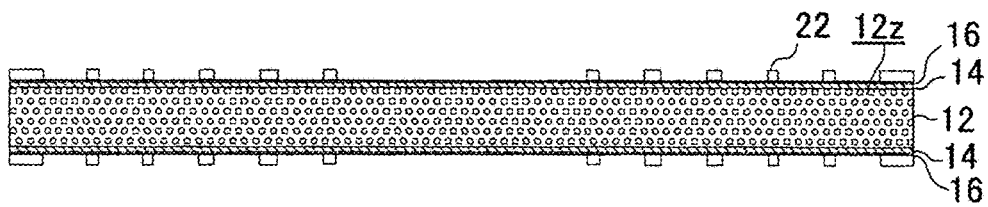
Figure 3C:
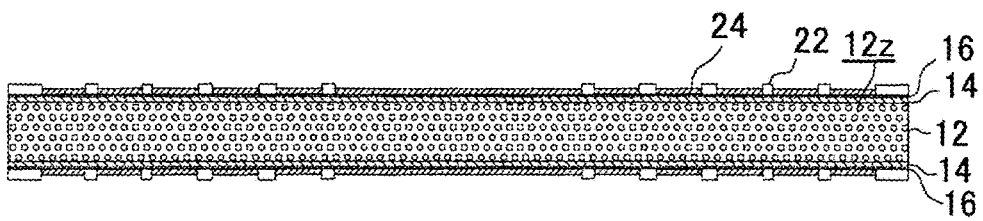

A plating resist 22 of a predetermined pattern is formed on the ultra-thin copper foil 16 of the support plate (12z) (FIG. 3B). An electrolytic copper plating film 24 is formed in a non-forming portion of the plating resist by electrolytic copper plating (FIG. 3C).

Figure 3D:
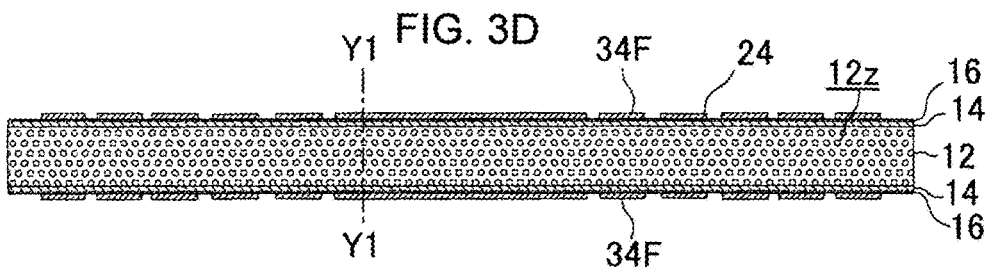

The plating resist is peeled off, and the second conductor layer (34F) is formed from the electrolytic copper plating film 24 (FIG. 3D). FIG. 9A illustrates a Y1-Y1 cross section of FIG. 3D. A line width (L1) and a space width (S1), L1/S1, of the second conductor layer (34F) are respectively set to 7.5/7.5 μm or less and 3/3 μm or more. The second conductor layer (34F), which is a dedicated wiring layer for data transmission between a first electronic component and a second electronic component, is formed at a fine pitch, and thus a roughened layer is not provided. Instead of a roughened layer, for example, a triazine compound described in Japanese Patent Laid-Open Publication No. 2001-203462 may be formed on a surface of the second conductor layer (34F), or the surface of the second conductor layer (34F) may be treated using a GT process of MEC Co., Ltd. The entire contents of Japanese Patent Laid-Open Publication No. 2001-203462 are incorporated herein by reference. Here, a special surface treatment is performed. However, it is also possible that, in the same way as a usual semi-additive method, a resin insulating layer is formed after a conductor surface is roughened.

Figure 3E:
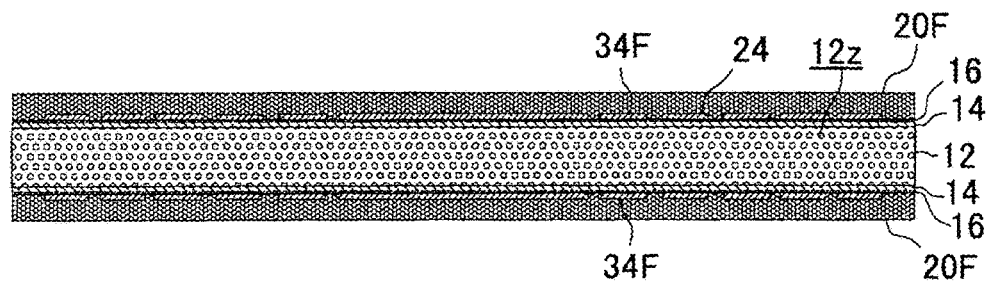

The second resin insulating layer (20F) is formed on the support plate (12z) on which the second conductor layer (34F) is provided (FIG. 3E). The second resin insulating layer (20F) is formed of a resin and a reinforcing material. Examples of the reinforcing material include a glass cloth, aramid fiber, glass fiber, and the like. Examples of the resin include an epoxy resin, a BT (bismaleimide triazine) resin, and the like. Adhesion between the second conductor layer (34F) and the second resin insulating layer (20F) is improved by the above-described surface treatment of the second conductor layer (34F).

Figure 4A:
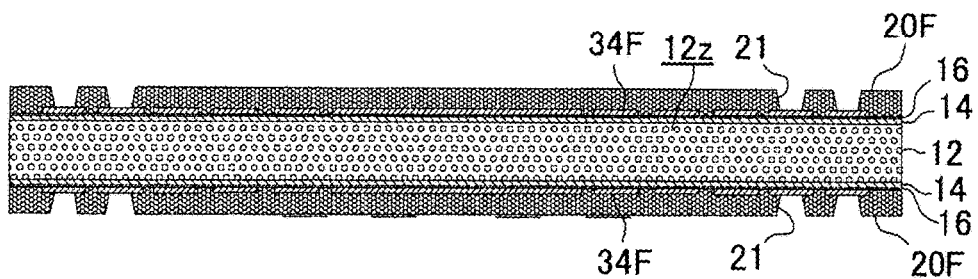
FIG. 4A-4D are process diagrams illustrating the method for manufacturing the package substrate of the first embodiment.

Openings 21 for via conductors that reach the second conductor layer (34F) are formed in the resin insulating layer (20F) using CO2 gas laser (FIG. 4A).

Figure 4B:
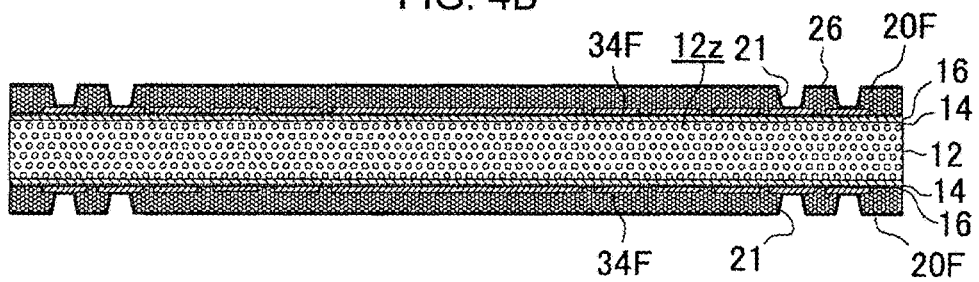

An electroless copper plating film 26 is formed on the resin insulating layer (20F) and on inner walls of the openings (21 (FIG. 4B).

Figure 4C:
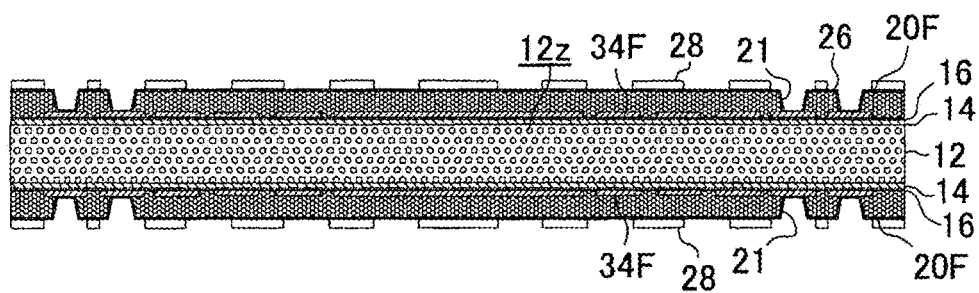

A plating resist 28 is formed on the electroless copper plating film 26 (FIG. 4C).

Figure 4D:
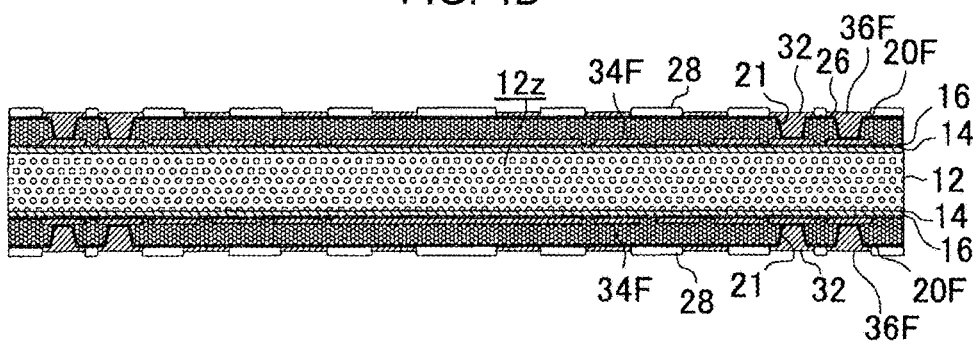

An electrolytic copper plating film 32 is formed on the electroless copper plating film 26 that is exposed from the plating resist 28. In this case, the openings 21 are filled with the electrolytic plating film 32. The second via conductors (36F) are formed (FIG. 4D).

Figure 5A:
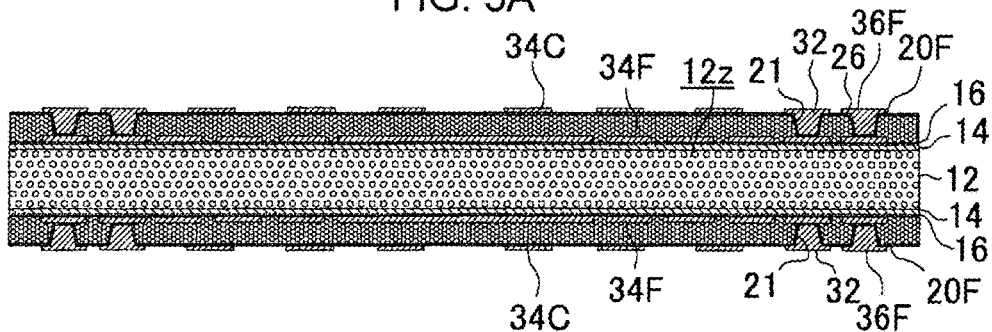
FIG. 5A-5D are process diagrams illustrating the method for manufacturing the package substrate of the first embodiment.
Figure 5B:
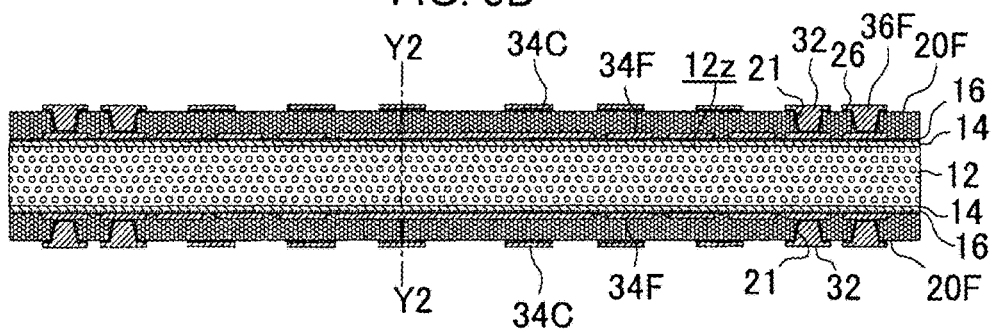

The plating resist 28 is removed. The electroless copper plating film 26 that is exposed from the electrolytic copper plating film 32 is removed. The third conductor layer (34C) is formed on the resin insulating layer (20F) (FIG. 5A). A roughened layer is formed on the surface of the third conductor layer (34C) that includes lands of the second via conductors (36F) (FIG. 5B). FIG. 9B illustrates the Y2-Y2 cross section of FIG. 5B. The roughened layer is formed on the surface of the third conductor layer (34C) that includes the lands of the second via conductors (36F). The roughened layer can be formed using an etching solution containing a cupric complex and an organic acid, or by electroless plating, an oxidation reduction treatment or the like. The third conductor layer (34C) has a wiring density lower than that of the above-described first conductor layer. A line width (L2) and a space width (S2), L2/S2, of the third conductor layer (34C) are respectively more than 7.5/7.5 µm.

Figure 5C:
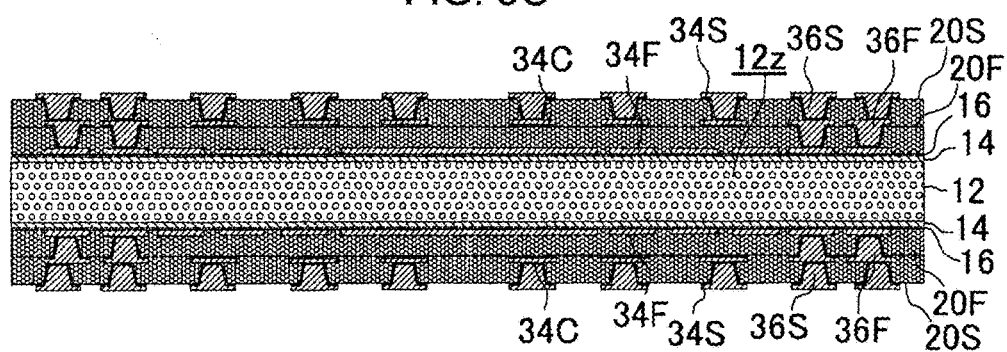

The processes of FIG. 3E-5B are repeated, and the resin insulating layer (20S), the conductor layer (34S), and the via conductors (36S) that penetrate the resin insulating layer (20S) are formed on the second resin insulating layer (20F) and the third conductor layer (34C) (FIG. 5C).

Figure 5D:
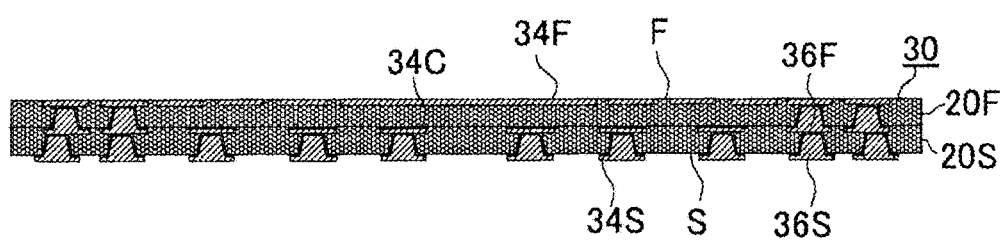

After the carrier copper foil 14 and the ultra-thin copper foil 16 of the support plate (12z) are mechanically separated, the ultra-thin copper foil 16 is peeled off by etching, the middle substrate 30 that includes the second resin insulating layer (20F), the resin insulating layer (20S), the second conductor layer (34F), the third conductor layer (34C), the conductor layer (34S), the second via conductors (36F) and the via conductors (36S) is completed (FIG. 5D). The middle substrate 30 has the main surface (F) on the upper side and the sub surface (S) that is on an opposite side of the main surface.

Figure 6A:
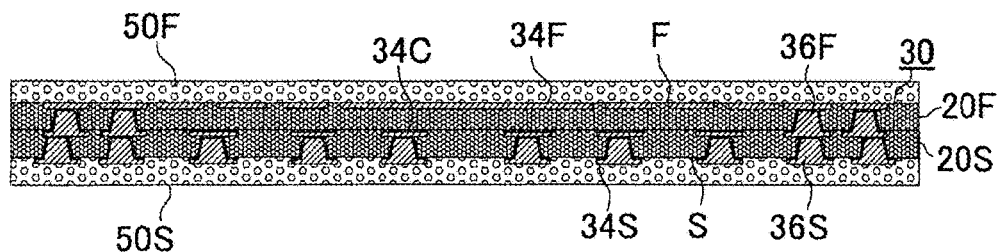
FIG. 6A-6D are process diagrams illustrating the method for manufacturing the package substrate of the first embodiment.

A resin film of a B-stage is laminated on the main surface (F) and the sub surface (S) of the middle substrate 30. The resin film is cured, and the upper side first resin insulating layer (50F) is formed on the main surface (F) and the lower side resin insulating layer (50S) is formed on the sub surface (S) (FIG. 6A). The first resin insulating layer (50F) and the lower side resin insulating layer (50S) each contain inorganic particles such as silica and a thermosetting resin such as epoxy. The resin insulating layers may each further contain a reinforcing material such as a glass cloth.

Figure 6B:
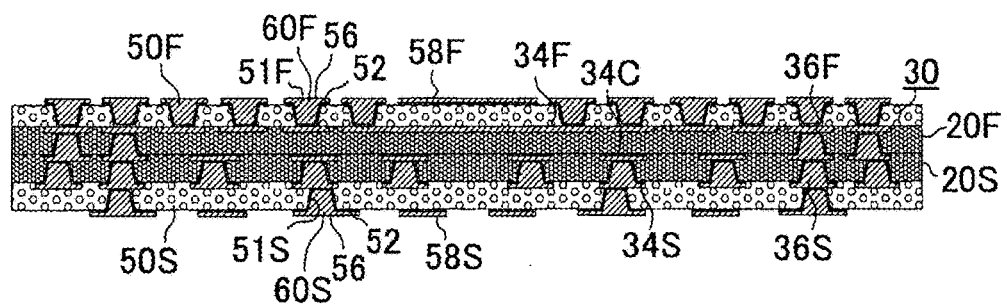
Figure 6C:
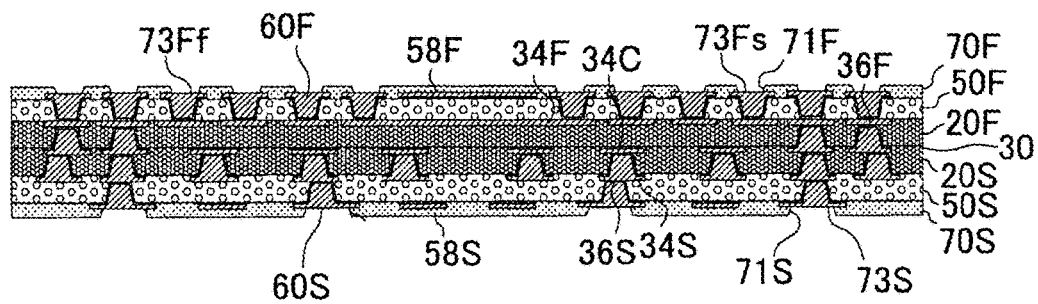

Through the same processes as those of FIG. 4A-5B, on the upper side first resin insulating layer (50F), the first conductor layer (58F), and the first via conductors (60F) that penetrate the upper side resin insulating layer and connect the first conductor layer (58F) and the second conductor layer (34F), are formed. Similarly, on the lower side resin insulating layer (50S), the lowermost conductor layer (58S), and the via conductors (60S) that penetrate the lower side resin insulating layer and connect the lowermost conductor layer (58S) and the conductor layer (34S), are formed (FIG. 6B).

The upper side solder resist layer (70F) having the openings (71F) is formed on the upper side first resin insulating layer (50F), and the lower side solder resist layer (70S) having the openings (71S) is formed on the lower side resin insulating layer (50S). Upper surfaces of the primary pads (73Ff) and the secondary pads (73Fs) are exposed from the openings (71F) of the first solder resist layer (70F). On the other hand, upper surfaces of the conductor layers and via lands that are exposed from the openings (71S) of the second solder resist layer (70S) function as the pads (73S) for connecting to a motherboard.

Figure 6D:
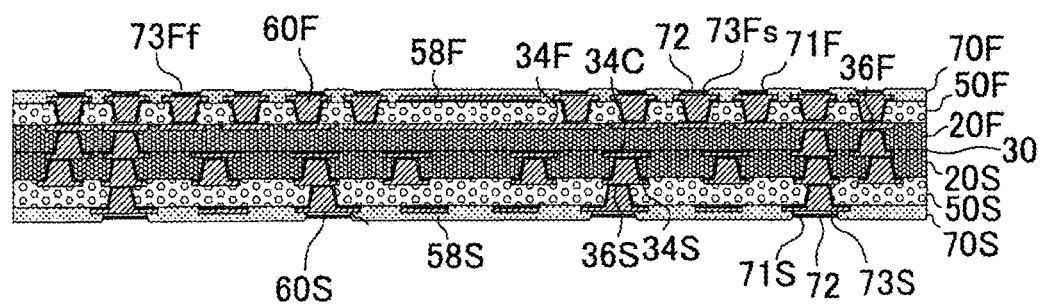

A nickel plating layer is formed on each of the pads (73Ff, 73Fs, 73S), and a gold plating layer is further formed on the nickel plating layer. Thereby, the metal film 72 that includes the nickel plating layer and the gold plating layer is formed (FIG. 6D). It is also possible that, instead of the nickel-gold layer, a nickel-palladium-gold layer or an OSP film is formed.

Solder balls are mounted on the pads (73Ff, 73Fs, 73S), and the solder bumps (76Fs, 76Ff, 76S) are formed by reflow. The package substrate 10 is completed (FIG. 1).

The logic IC chip (110L) is mounted on the solder bumps (76Ff) on the primary pads. The memory (110M) is mounted on the solder bumps (76Fs) on the secondary pads (FIGS. 2 and 7B). Spaces between the package substrate and the IC chip (110L) and the memory (110M) are filled with an underfill 114 (FIG. 2).

Second Embodiment

Figure 10:
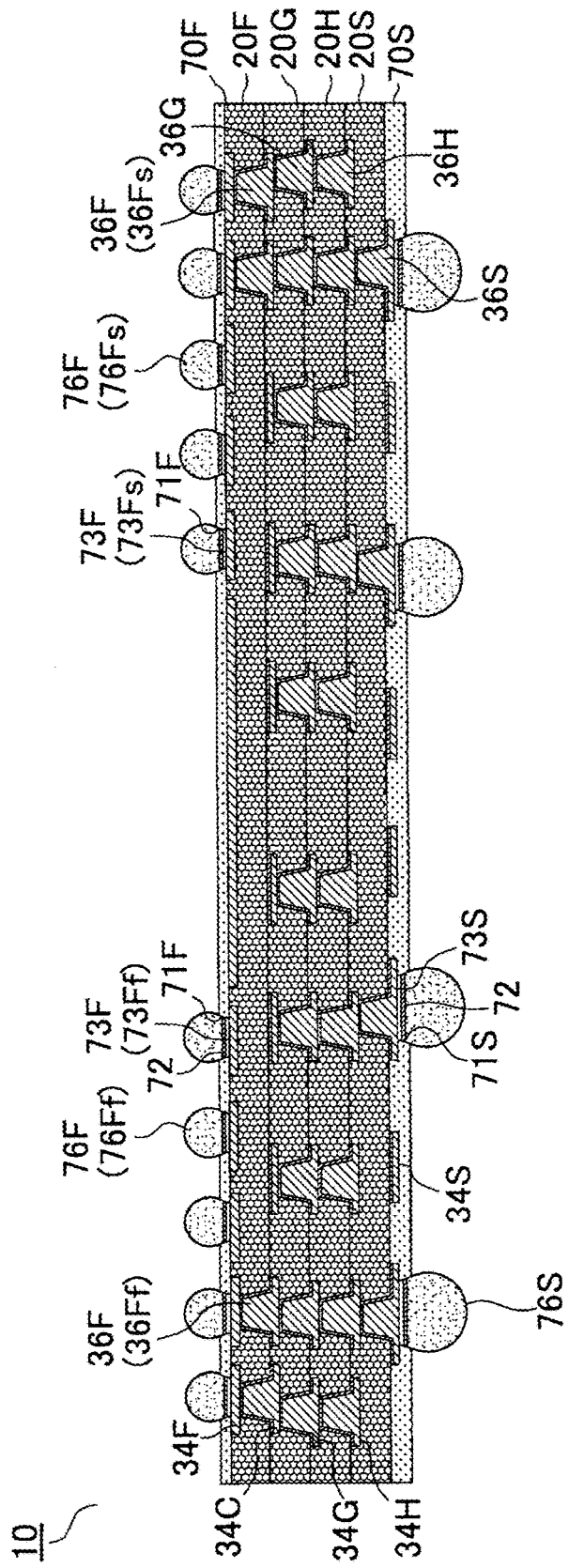
FIG. 10 illustrates a cross-sectional view of a package substrate according to a second embodiment of the present invention.

FIG. 10 illustrates a cross section of a package substrate of a second embodiment. FIG. 11 illustrates a cross section of an application example of the package substrate of the second embodiment. The solder bumps (76Ff) for mounting the first electronic component (110L) are formed on the primary pads (73Ff). The solder bumps (76Fs) for mounting the second electronic component (110M) are formed on the secondary pads (73Fs).

The package substrate of the second embodiment has, as an outermost conductor layer, the second conductor layer (34F) that contains the pads for mounting the electronic components. Further, the package substrate has the second resin insulating layer (20F) that supports the second conductor layer (34F).

In the second embodiment, first via conductors (36Ff) that connect to the primary pads (73Ff), and second via conductors (36Fs) that connect to the secondary pads (73Fs), are formed in the second resin insulating layer (20F). It is preferable that the first via conductors be formed directly below the primary pads. It is preferable that the second via conductors be formed directly below the secondary pads.

The second conductor layer (34F) includes second conductor circuits. The primary pads and the secondary pads are connected by the second conductor circuits. The second conductor layer is a dedicated wiring layer for exchange of signals between the first electronic component and the second electronic component.

A middle upper side resin insulating layer (20G) is formed below the second resin insulating layer (20F) and the third conductor layer (34C). A middle upper side conductor layer (34G) is formed below the middle upper side resin insulating layer (20G). The third conductor layer (34C) and the middle upper side conductor layer (34G) are connected to each other via via conductors (36G) that are formed in the middle upper side resin insulating layer (20G).

A middle lower side resin insulating layer (20H) is formed below the middle upper side resin insulating layer (20G) and the middle upper side conductor layer (34G). A middle lower side conductor layer (34H) is formed below the middle lower side resin insulating layer (20H). The middle upper side conductor layer (34G) and the middle lower side conductor layer (34H) are connected to each other via via conductors (36H) that are formed in the middle lower side resin insulating layer (20H).

The resin insulating layer (20S) is formed below the middle lower side resin insulating layer (20H) and the middle lower side conductor layer (34H). The conductor layer (34S) is formed below the resin insulating layer (20S). The middle lower side conductor layer (34H) and the conductor layer (34S) are connected to each other via the via conductors (36S) that are formed in the resin insulating layer (20S).

The solder resist layer (70F) having the openings (71F) is formed on the second resin insulating layer (20F), and the solder resist layer (70S) having the openings (71S) is formed on the resin insulating layer (20S). The primary pads (73Ff) and the secondary pads (73Fs) are exposed by the openings (71F) of the solder resist layer (70F) on the second resin insulating layer (20F). The solder bumps (76Ff) are formed on the primary pads (73Ff), and the solder bumps (76Fs) are formed on the secondary pads (73Fs). The solder bumps (76S) for connecting to a motherboard are formed on pads (73S) that are exposed by the openings (71S) of the solder resist layer (70S) on the lower side resin insulating layer (20S). The metal film 72 such as Ni/Au or Ni/Pd/Au is formed on each of the pads (73Ff, 73Fs, 73S). As illustrated in FIG. 11, the IC chip (110L) is mounted on the solder bumps (76Ff) for mounting the IC chip, and the memory (110M) is mounted on the solder bumps (76Fs) for mounting the memory. The package substrate 10 is mounted on a motherboard via the solder bumps (76S).

As illustrated in FIG. 10, the second conductor layer (34F) is embedded in the second resin insulating layer (20F) and only the upper surface thereof is exposed from the second resin insulating layer (20F). That is, a side surface of the second conductor layer (34F) is embedded in the second resin insulating layer (20F). FIG. 9B illustrates the third conductor layer (34C) before being embedded in the resin insulating layer. The roughened layer 35 is provided in the third conductor layer (34C). FIG. 9A illustrates the second conductor layer (34F) before being embedded in the first resin insulating layer. A roughened layer is not provided on the side surface and the upper surface of the second conductor layer (34F). The line width (L1) and the space width (S1), L1/S1, of the second conductor layer (34F) are respectively set to 7.5/7.5 µm or less and 3/3 µm or more. Even when the space width is 3 µm, since a roughened layer is not provided, the first resin insulating layer can be filled in the space without leaving air bubbles therein. Therefore, even when the wiring density of the second conductor layer (34F) is increased, the insulation reliability is hardly lowered, and the signal transmission amount can be increased.

Method for Manufacturing Package Substrate of Second Embodiment

A method for manufacturing the package substrate 10 of the second embodiment is illustrated in FIG. 12A-12D.

Through the processes of the first embodiment illustrated in FIG. 1-5B, the second conductor layer (34F), the second resin insulating layer (20F), the third conductor layer (34C) and the via conductors (36F) are formed on the support plate (12z) (FIG. 5B).

Figure 12A:
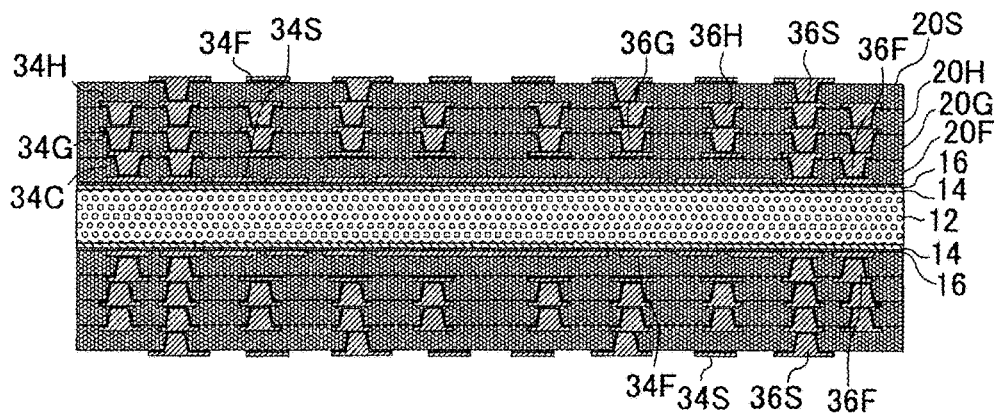
FIG. 12A-12D are process diagrams illustrating a method for manufacturing the package substrate of the second embodiment.

The same processes in which the second resin insulating layer (20F), the third conductor layer (34C) and the via conductors (36F) are formed are repeated, and the middle upper side resin insulating layer (20G), the middle upper side conductor layer (34G) and the via conductors (36G) That penetrate the middle upper side resin insulating layer (20G)) are formed on the second resin insulating layer (20F). The middle lower side resin insulating layer (20H), the middle lower side conductor layer (34H) and the via conductors (36H) (that penetrate the middle lower side resin insulating layer (20H)) are formed on the middle upper side resin insulating layer (20G). The resin insulating layer (20S), the conductor layer (34S) and the via conductors (36S) (that penetrate the resin insulating layer (20S)) are formed on the middle lower side resin insulating layer (20H) (FIG. 12A).

Figure 12B:
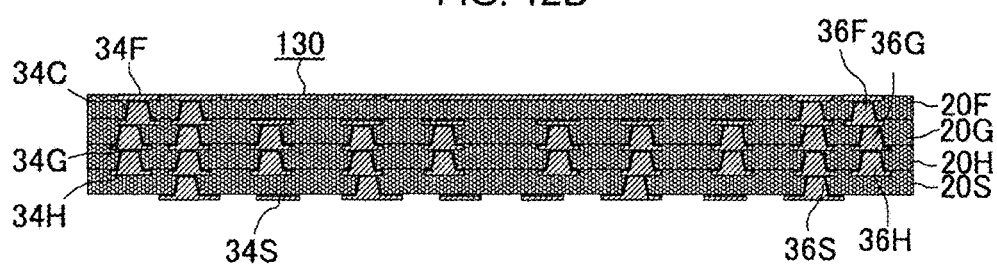
Figure 12C:
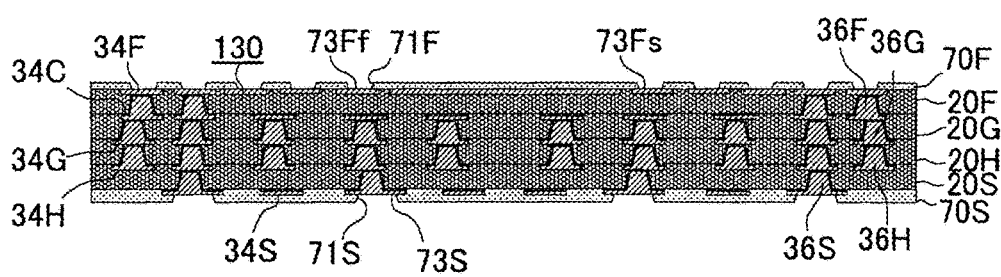

After the carrier copper foil 14 and the ultra-thin copper foil 16 of the support plate (12z) are mechanically separated, the ultra-thin copper foil 16 is peeled off by etching, and an intermediate 130 is completed that includes the second resin insulating layer (20F), the middle upper side resin insulating layer (20G), the middle lower side resin insulating layer (20H), the resin insulating layer (20S), the second conductor layer (34F), the third conductor layer (34C), the middle upper side conductor layer (34G), the middle lower side conductor layer (34H), the conductor layer (34S), and the via conductors (36F, 36G, 36H, 36S) (FIG. 12B).

The upper side solder resist layer (70F) having the openings (71F) is formed on the second resin insulating layer (20F), and the lower side solder resist layer (70S) having the openings (71S) is formed on the resin insulating layer (20S). The upper surfaces of the primary pads (73Ff) and the secondary pads (73Fs) are exposed from the openings (71F) of the first solder resist layer (70F). On the other hand, the upper surfaces of the conductor layers and via lands that are exposed from the openings (71S) of the second solder resist layer (70S) function as the pads (73S) for connecting to a motherboard.

Figure 12D:
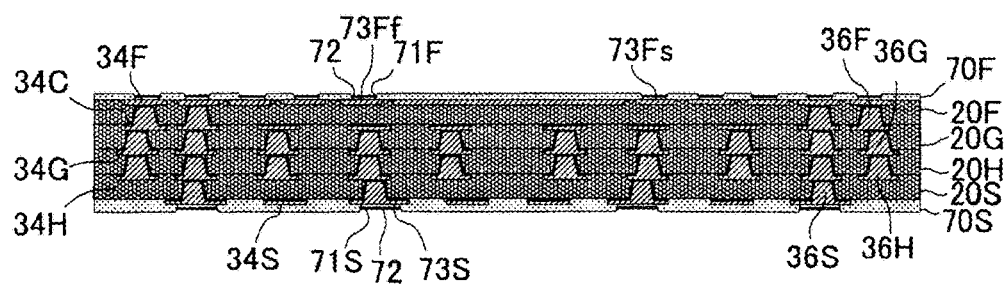

A nickel plating layer is formed on each of the pads (73Ff, 73Fs, 73S), and a gold plating layer is further formed on the nickel plating layer. Thereby, the metal film 72 that includes the nickel plating layer and the gold plating layer is formed (FIG. 12D). It is also possible that, instead of the nickel-gold layer, a nickel-palladium-gold layer or an OSP film is formed.

Solder balls are mounted on the pads (73Ff, 73Fs, 73S), and the solder bumps (76Fs, 76Ff, 76S) are formed by reflow. The package substrate 10 is completed (FIG. 10).

Third Embodiment

Figure 13:
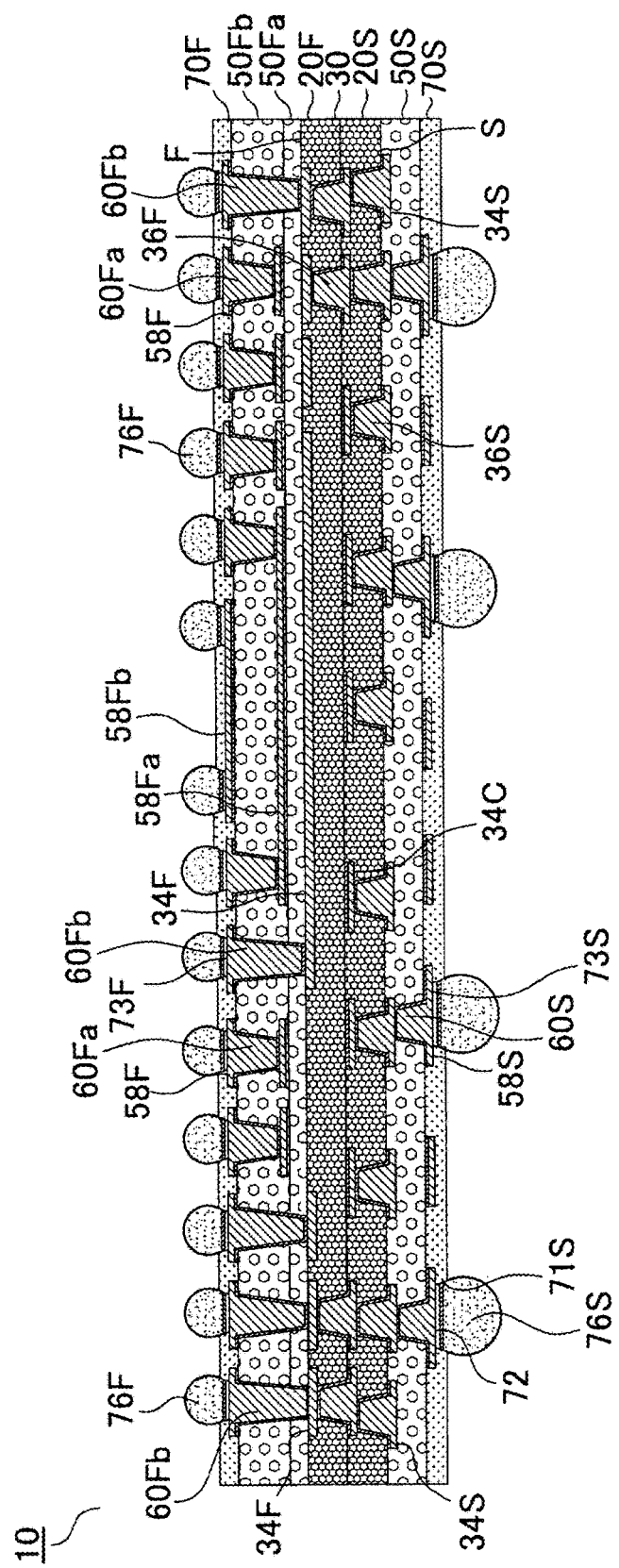
FIG. 13 illustrates a cross-sectional view of a package substrate according to a third embodiment of the present invention.

FIG. 13 illustrates a package substrate of a third embodiment.

In the third embodiment, similar to the first embodiment, the second conductor layer (34F), of which a side surface is embedded in the second resin insulating layer (20F), is formed. The second conductor layer (34F) is used for data transmission.

In the package substrate of the third embodiment, an upper side resin insulating layer is formed to have a two-layer structure including an upper-layer first resin insulating layer (50Fb) and a lower-layer first resin insulating layer (50Fa). A lower-layer first conductor layer (58Fa) is formed on the lower-layer first resin insulating layer (50Fa). An upper-layer first conductor layer (58Fb) is formed on the upper-layer first resin insulating layer (50Fb). The upper-layer first conductor layer (58Fb) and the second conductor layer (34F) are directly connected via skip via conductors (60Fb) that penetrate the upper-layer first resin insulating layer (50Fb) and the lower-layer first resin insulating layer (50Fa). The upper-layer first conductor layer (58Fb) and the lower-layer first conductor layer (58Fa) are connected via via conductors (60Fa) that penetrate the upper-layer first resin insulating layer (50Fb).

In the third embodiment, together with the second conductor layer (34F), the upper-layer first conductor layer (58Fb) or the lower-layer first conductor layer (58Fa) is used for data transmission.

Fourth Embodiment

Figure 14:
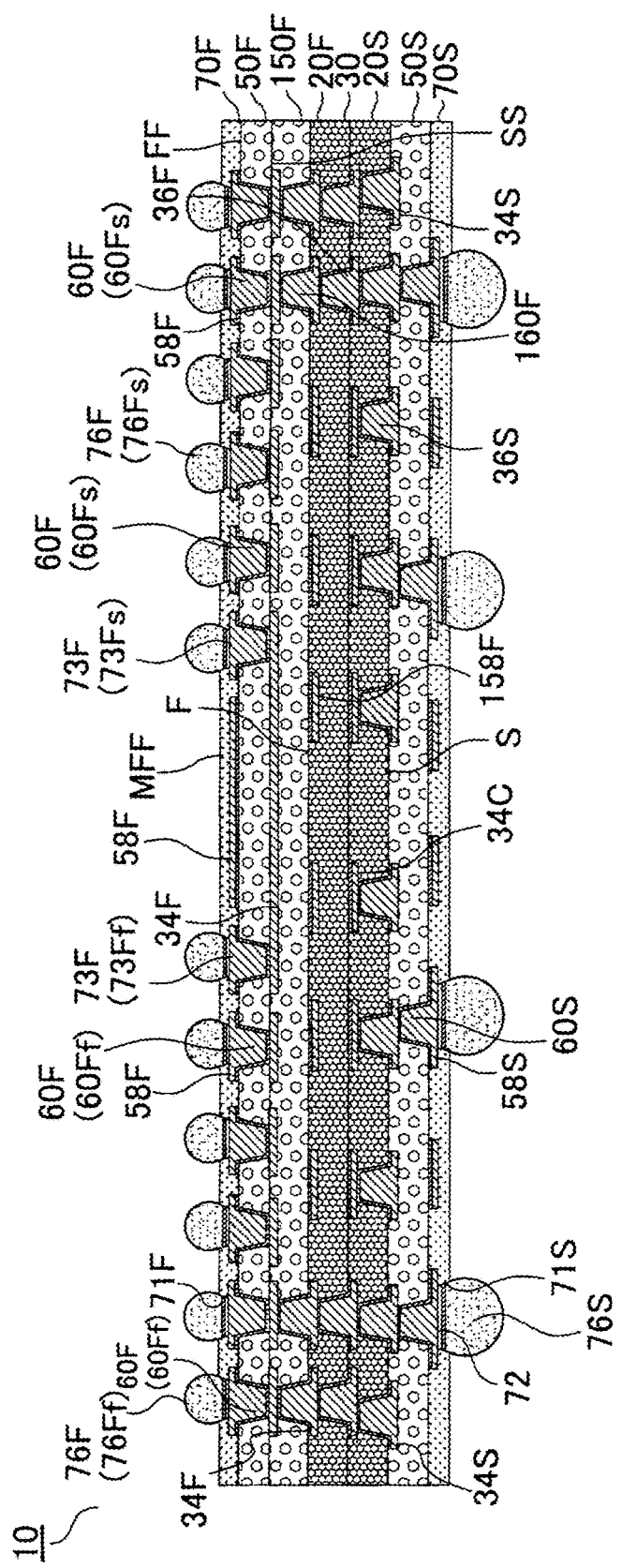
FIG. 14 illustrates a cross-sectional view of a package substrate according to a fourth embodiment of the present invention.

FIG. 14 illustrates a package substrate of a fourth embodiment.

In the fourth embodiment, two build-up layers are formed on the main surface (F) of the middle substrate 30, and one build-up layer is formed on the sub surface (S). That is, between the first resin insulating layer (50F) and the second resin insulating layer (20F), a resin insulating layer (150F) that includes via conductor (160F) and a conductor layer (158F) is formed.

Roughened layer may be provided in conductor layers for enhancing adhesion to resin insulating layers, but when insulation distance between wirings is set to 7.5 μm or less, it becomes difficult to completely fill spacing between wirings with a resin insulating layer, and air bubbles remains and insulation reliability is lowered. It may be difficult to increase a wiring density of a wiring layer and to increase a signal transmission amount.

A package substrate according to an embodiment of the present invention allows a wiring density of a wiring layer for data transmission to be increased and a signal transmission amount to be increased.

A printed wiring board according to an embodiment of the present invention includes: a first resin insulating layer that has a first surface and a second surface; a mounting surface for mounting two electronic components on the first surface of the first resin insulating layer; a first conductor layer that is formed on the first surface of the first resin insulating layer; a second conductor layer that is formed on the second surface of the first resin insulating layer; a first via conductor that connects the first conductor layer and the second conductor layer; a second resin insulating layer that is formed on the second surface of the first resin insulating layer; a third conductor layer that is formed on the second resin insulating layer; and a second via conductor that connects the second conductor layer and the third conductor layer. The second conductor layer includes a dedicated wiring layer for data transmission that connects between the two electronic components. The dedicated wiring layer is embedded in the second resin insulating layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a first resin insulating layer;
   a first conductor layer formed on a first surface of the first resin insulating layer;
   a second conductor layer formed on a second surface of the first resin insulating layer;
   a first via conductor structure formed in the first resin insulating layer such that the first via conductor structure is connecting the first conductor layer and the second conductor layer;
   a second resin insulating layer formed on the second surface of the first resin insulating layer such that the second conductor layer is embedded into the second resin insulating layer and that the first resin insulating layer is covering the second conductor layer;
   a third conductor layer formed on the second resin insulating layer; and
   a second via conductor structure formed in the second resin insulating layer such that the second via conductor structure is connecting the second conductor layer and the third conductor layer,
   wherein the first conductor layer is an outermost conductor layer and includes a plurality of primary pads and a plurality of secondary pads such that the primary pads are positioned to mount a first electronic component on the first surface of the first resin insulating layer and the secondary pads are positioned to mount a second electronic component on the first surface of the first resin insulating layer, and the second conductor layer includes a dedicated wiring layer configured to transmit data between the first and second electronic components to be mounted to the first surface of the first resin insulating layer.

2. A printed wiring board according to claim 1, wherein the first conductor layer, the dedicated wiring layer of the second conductor layer and the third conductor layer form a strip line structure.

3. A printed wiring board according to claim 2, wherein the dedicated wiring layer of the second conductor layer has an insulation distance between wirings set in a range of 7.5 μm or less.

4. A printed wiring board according to claim 1, wherein the second conductor layer has a first surface in contact with the second surface of the first resin insulating layer and a second surface and a side surface in contact with the second resin insulating layer such that the second surface and side surface of the second conductor layer do not include a roughened surface.

5. A printed wiring board according to claim 4, wherein the second surface and side surface of the second conductor layer have an arithmetic average roughness Ra in a range of 0.02 μm to 0.18 μm.

6. A printed wiring board according to claim 5, wherein the dedicated wiring layer of the second conductor layer has an insulation distance between wirings set in a range of 7.5 μm or less.

7. A printed wiring board according to claim 5, wherein the second conductor layer has a line width L1 and a space width S1 such that L1/S1 of the second conductor layer is set in a range of 3/3 μm or more to 7.5/7.5 μm or less.

8. A printed wiring board according to claim 5, wherein the first conductor layer, the dedicated wiring layer of the second conductor layer and the third conductor layer form a strip line structure.

9. A printed wiring board according to claim 4, wherein the first surface of the second conductor layer includes a roughened surface.

10. A printed wiring board according to claim 9, wherein the first surface of the second conductor layer has an arithmetic average roughness Ra in a range of 0.35 μm to 0.51 μm.

11. A printed wiring board according to claim 10, wherein the dedicated wiring layer of the second conductor layer has an insulation distance between wirings set in a range of 7.5 μm or less.

12. A printed wiring board according to claim 10, wherein the second conductor layer has a line width L1 and a space width S1 such that L1/S1 of the second conductor layer is set in a range of 3/3 μm or more to 7.5/7.5 μm or less.

13. A printed wiring board according to claim 10, wherein the first conductor layer, the dedicated wiring layer of the second conductor layer and the third conductor layer form a strip line structure.

14. A printed wiring board according to claim 9, wherein the dedicated wiring layer of the second conductor layer has an insulation distance between wirings set in a range of 7.5 μm or less.

15. A printed wiring board according to claim 4, wherein the dedicated wiring layer of the second conductor layer has an insulation distance between wirings set in a range of 7.5 μm or less.

16. A printed wiring board according to claim 1, wherein the dedicated wiring layer of the second conductor layer has an insulation distance between wirings set in a range of 7.5 μm or less.

17. A printed wiring board according to claim 1, wherein the second conductor layer has a line width L1 and a space width S1 such that L1/S1 of the second conductor layer is set in a range of 3/3 μm or more to 7.5/7.5 μm or less.

18. A printed wiring board according to claim 17, wherein the first conductor layer, the dedicated wiring layer of the second conductor layer and the third conductor layer form a strip line structure.

19. A printed wiring board according to claim 1, wherein the first via conductor structure comprises a plurality of primary via conductors and a plurality of secondary via conductors formed in the first resin insulating layer such that the primary via conductors are connecting the plurality of primary pads in the first conductor layer and a plurality of primary via conductor pads in the second conductor layer, respectively, and that the secondary via conductors are connecting the plurality of secondary pads in the first conductor layer and a plurality of secondary via conductor pads in the second conductor layer, respectively, the second conductor layer is formed such that the dedicated wiring layer is connecting the plurality of primary via conductor pads and the plurality of secondary via conductor pads, respectively, and the second via conductor structure comprises a plurality of second via conductors formed in the second resin insulating layer such that the second via conductors are connecting the second conductor layer and the third conductor layer, respectively.

20. A printed wiring board according to claim 1, further comprising:

the first and second electronic components mounted to the first surface of the first resin insulating layer.

* * * * *